(12) United States Patent
Kaynak et al.

(10) Patent No.: US 12,142,333 B2
(45) Date of Patent: Nov. 12, 2024

(54) ERROR CORRECTION IN A MEMORY DEVICE HAVING AN ERROR CORRECTION CODE OF A PREDETERMINED CODE RATE

(71) Applicant: Micron Technology, Inc., Boise, ID (US)

(72) Inventors: Mustafa N. Kaynak, San Diego, CA (US); Kishore Kumar Muchherla, Fremont, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/712,550

(22) Filed: Apr. 4, 2022

(65) Prior Publication Data

US 2023/0317195 A1    Oct. 5, 2023

(51) Int. Cl.
| | | |
|---|---|---|
| G11C 29/40 | (2006.01) | |
| G11C 29/00 | (2006.01) | |
| G11C 29/24 | (2006.01) | |
| G11C 29/42 | (2006.01) | |
| H03M 13/11 | (2006.01) | |

(52) U.S. Cl.
CPC ............ *G11C 29/40* (2013.01); *G11C 29/24* (2013.01); *G11C 29/42* (2013.01); *G11C 29/781* (2013.01); *H03M 13/1177* (2013.01)

(58) Field of Classification Search
None
See application file for complete search history.

(56) References Cited

U.S. PATENT DOCUMENTS

| | | | | |
|---|---|---|---|---|
| 4,972,417 | A * | 11/1990 | Sako ............... | G11B 20/1809 |
| 6,519,732 | B1 * | 2/2003 | Li ..................... | H03M 13/2957 |
| | | | | 714/755 |
| 2008/0141103 | A1 * | 6/2008 | Miyazaki ......... | H03M 13/2957 |
| | | | | 714/801 |
| 2010/0098185 | A1 * | 4/2010 | Miyazaki ......... | H04L 1/0066 |
| | | | | 375/267 |

(Continued)

OTHER PUBLICATIONS

M. Beermann, T. Breddermann and p. Vary, "Rate-compatible LDPC codes using optimized dummy bit insertion," 2011 8th International Symposium on Wireless Communication Systems, Aachen, Germany, 2011, pp. 447-451.*

(Continued)

*Primary Examiner* — Steve N Nguyen
(74) *Attorney, Agent, or Firm* — Greenberg Traurig (57) ABSTRACT

An apparatus having memory cells, an error correction module with a predetermined code rate, a processing device configured to arrange data storage in the memory cells for improved capability in recovering from random bit errors in raw data retrieved from the memory cells. For example, user data and redundant data are stored in the memory cells. The redundant data is generated according to the predetermined code rate from not only the user data but also known data. The known data is not stored in the memory cells. As a result, the error correction module has increased capability in recovering from random bit errors in raw data retrieved from the memory cells. The increased capability can be used to extend the useful life of the memory cells and/or improve the reliability of retrieving error free data from the memory cells.

20 Claims, 6 Drawing Sheets

(56) References Cited

U.S. PATENT DOCUMENTS

| | | | | |
|---|---|---|---|---|
| 2011/0283162 A1* | 11/2011 | Murakami | ......... | H03M 13/1111 |
| | | | | 714/758 |
| 2011/0283166 A1* | 11/2011 | Kim | ...................... | G06F 11/106 |
| | | | | 714/E11.034 |
| 2011/0320915 A1* | 12/2011 | Khan | .................. | H03M 13/353 |
| | | | | 714/763 |
| 2012/0102295 A1* | 4/2012 | Yang | ................... | G06F 12/0246 |
| | | | | 711/E12.078 |
| 2012/0240007 A1* | 9/2012 | Barndt | .............. | H03M 13/3707 |
| | | | | 714/E11.03 |
| 2012/0260149 A1* | 10/2012 | Chang | .................. | H03M 13/13 |
| | | | | 714/763 |
| 2020/0293396 A1* | 9/2020 | Golov | ................. | G06F 11/1068 |

OTHER PUBLICATIONS

W. Xu and J. Romme, "A class of multirate convolutional codes by dummy bit insertion," Globecom '00—IEEE. Global Telecommunications Conference. Conference Record (Cat. No. 00CH37137), San Francisco, CA, USA, 2000, pp. 830-834 vol. 2.*

* cited by examiner

ERROR CORRECTION IN A MEMORY DEVICE HAVING AN ERROR CORRECTION CODE OF A PREDETERMINED CODE RATE

TECHNICAL FIELD

At least some embodiments disclosed herein relate to memory systems in general, and more particularly, but not limited to memory systems configured with a predetermined rate of error correction code.

BACKGROUND

A memory sub-system can include one or more memory devices that store data. The memory devices can be, for example, non-volatile memory devices and volatile memory devices. In general, a host system can utilize a memory sub-system to store data at the memory devices and to retrieve data from the memory devices.

BRIEF DESCRIPTION OF THE DRAWINGS

The embodiments are illustrated by way of example and not limitation in the figures of the accompanying drawings in which like references indicate similar elements.

DETAILED DESCRIPTION

At least some aspects of the present disclosure are directed to a memory sub-system configured to extend the useful life of a memory device and/or improve the reliability of data retrieval from the memory device that uses an Error Correction Code having a predetermined code rate. Examples of storage devices and memory modules are described below in conjunction with FIG. 1. In general, a host system can utilize a memory sub-system that includes one or more components, such as memory devices that store data. The host system can provide data to be stored at the memory sub-system and can request data to be retrieved from the memory sub-system.

A conventional memory device can use an Error Correction Code (ECC) of a predetermined code rate to detect and correct random errors in data retrieved from the memory cells of the memory device. To detect and/or correct errors a data item is stored in the memory device together with redundant information according to the Error Correction Code (ECC). The ratio between the size of the data item and the size of the total data stored for the data item (e.g., the data item and the redundant information) corresponds to the code rate of the Error Correction Code (ECC). When there is a small number of random errors in the bits of the data item and/or the redundant information as retrieved from the memory cells, the errors can be detected and corrected using the technique of Error Correction Code (ECC). In general, the amount of redundant information stored for the data item and thus the code rate control the error correction capability of the Error Correction Code (ECC). When the bit error rate in the retrieved data increases, the probability of the Error Correction Code (ECC) failing to decode and thus recover an error free version of the data item increases. When the bit error rate is increased to a level such that the probability of decoding failure reaches a threshold, the bit error rate can be considered to exceed the error correction capability of the Error Correction Code (ECC).

A memory device ages through repeated cycles of programming the memory cells to store data and erasing the memory cells to allow the memory cells to be programmed again to store new data. As the memory device ages, the bit error rate in data retrieved from memory cells increases. When the bit error rate exceeds the error correction capability of the Error Correction Code (ECC), which is controlled in general by its code rate, the use of the Error Correction Code (ECC) may not be sufficient to correct the errors in the bits of data retrieved from the memory cells. Thus, an error-free version of the data item stored into the memory cell cannot be reliably recovered from the memory cells in a read operation. Therefore, after the memory cells in the memory device have been subjected to a number of program/erasure (PE) cycles, the bit error rate of data retrieved from memory cells can be considered to have reach or exceed the capability of the Error Correction Code (ECC) of the predetermined code rate. As a result, the memory cells and/or the memory device may be considered to have reached the end of its useful life in reliably storing data.

At least some aspects of the present disclosure address the above and other deficiencies by dividing a group of memory cells into a plurality of portions. Each of the portions store a user data item and respective redundant data, where the redundant data is derived, according to a predetermined code rate of an error correction decoder, from a combination of the user data item and known data (or a known data pattern). The known data is not stored in the group of memory cells to increase the utilization of the storage capacity of the group of memory cells. No portion of the group of memory cells is reserved for the programming of the known data and thus not utilized for storing of the plurality of portions.

For each of the plurality of portions, the ratio between the redundant data and the combined user data item and known data is the same as the predetermined code rate of the decoder. After the raw data representative of the plurality of portions is retrieved from the group of memory cells in a read operation, the known data is regenerated for the respective portion without using the raw data. The regenerated know data is then combined with the corresponding user data item and the redundant data of the respective portion as input data to the decoder of the predetermined code rate, as if the entire set of the input data containing the known data, the user data item, and the redundant data were determined from the states of the memory cells in the group. However, since the known data within the input data to the decoder is regenerated without errors (and without actually using the states of the memory cells in the group), random bit errors to be detected by the decoder are limited within the portion of the input data containing the user data item and the redundant data that are determined from the states of the memory cells. Thus, the decoder can recover an error-free version of the user data item even though the bit error rate within the portion of the input data containing the user data item and the redundant data is higher than the threshold bit error rate corresponding to the capability of the decoder for recovering from random bit errors in the entire set of input data received in the decoder.

User data and known data (or a known data pattern) can be combined as input data to be protected via an Error Correction Code (ECC) of a predetermined code rate. Redundant data can be generated according to the Error Correction Code (ECC) such that, when a version of the input data and the redundant data is provided to a decoder of the Error Correction Code (ECC) having the predetermined code rate, the decoder can provide an error free version of the input data when the bit error rate in the input data is below a threshold. When a portion of the input data corresponding to the known data is regenerated without error as input to the decoder, the capability of the decoder to recover errors from the remaining portion of the input data and the redundant data is increased to above the threshold of bit error rate.

In the group of memory cells, the ratio between the combined user data items from different portions and the combined user data and redundant data from different portions is smaller than the ratio of the predetermined code rate. Thus, the effective storage capacity for storing the user data items is smaller than a conventional way of storing user data items in the group of memory cells according to the Error Correction Code (ECC) of a predetermined code rate. However, the reduced the storage capacity is offset by the increased error correction capability in recovering data. Thus, when the bit error rate in the memory cells is above the threshold corresponding to the error recovery capability of the coder, the technique of storing redundant data derived from known data can allow the memory cells to further extend their useful life, using the decoder of the predetermined code rate. Thus, the useful life of the memory device in reliably storing data can be extended. When the techniques of the present disclosure are used, the memory cells and/or the memory device that would be otherwise considered to have reached the end of its useful life can continue to provide reliable storage services at a reduced storage capacity.

Similarly, the storage technique of using known data/data pattern to generate redundant data for user data items can be used to reduce the probability of read failures, in comparison with the conventional way of storing data according to the predetermined code rate.

Figure 1:
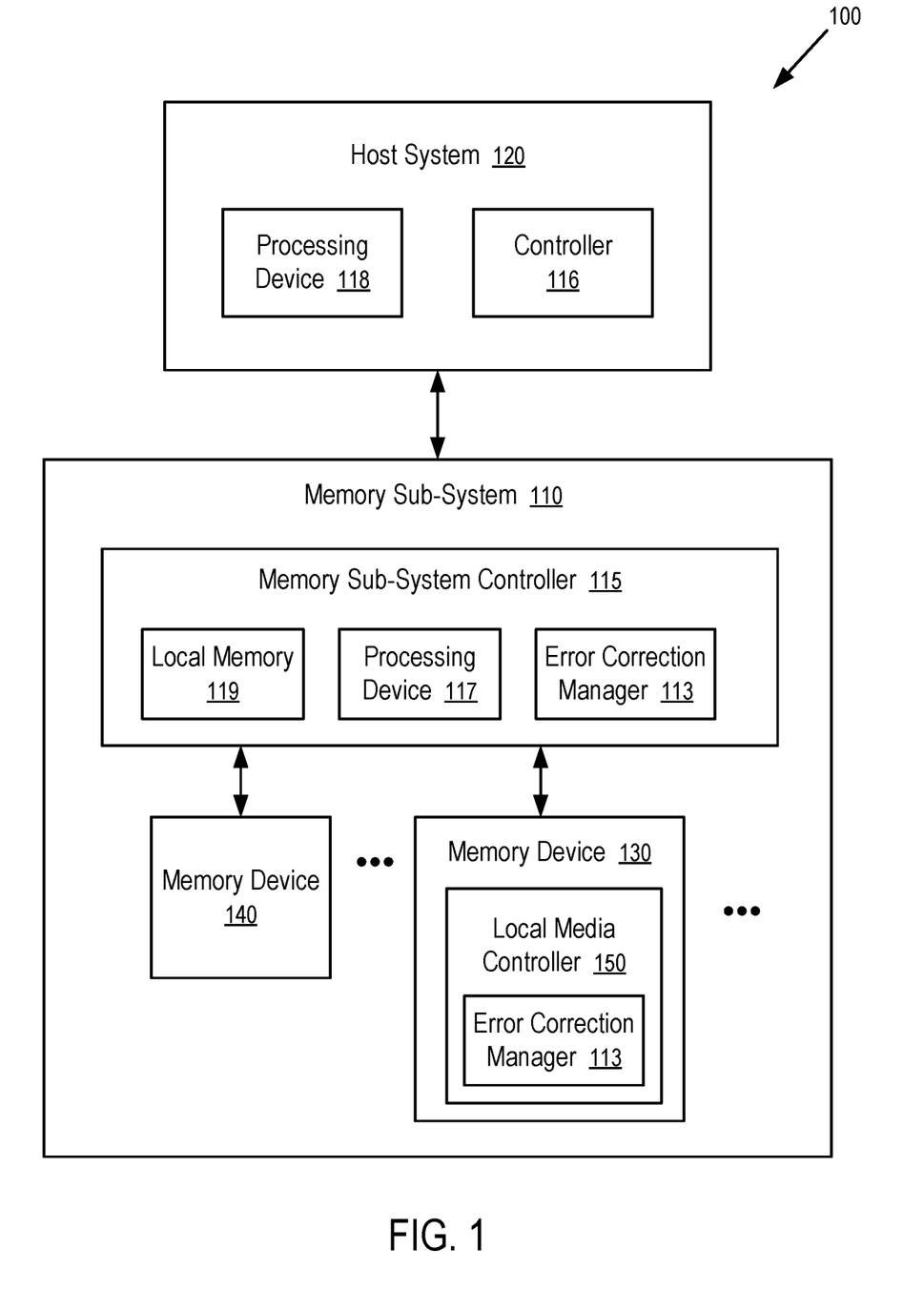
FIG. 1 illustrates an example computing system having a memory sub-system in accordance with some embodiments of the present disclosure.

FIG. 1 illustrates an example computing system 100 that includes a memory sub-system 110 in accordance with some embodiments of the present disclosure. The memory sub-system 110 can include media, such as one or more volatile memory devices (e.g., memory device 140), one or more non-volatile memory devices (e.g., memory device 130), or a combination of such.

In general, a memory sub-system 110 can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM), a small outline DIMM (SO-DIMM), and various types of non-volatile dual in-line memory module (NVDIMM).

The computing system 100 can be a computing device such as a desktop computer, a laptop computer, a network server, a mobile device, a vehicle (e.g., airplane, drone, train, automobile, or other conveyance), an Internet of Things (I) enabled device, an embedded computer (e.g., one included in a vehicle, industrial equipment, or a networked commercial device), or such a computing device that includes memory and a processing device.

The computing system 100 can include a host system 120 that is coupled to one or more memory sub-systems 110. FIG. 1 illustrates one example of a host system 120 coupled to one memory sub-system 110. As used herein, □coupled to□ or □coupled with□ generally refers to a connection between components, which can be an indirect communicative connection or direct communicative connection (e.g., without intervening components), whether wired or wireless, including connections such as electrical, optical, magnetic, etc.

For example, the host system 120 can include a processor chipset (e.g., processing device 118) and a software stack executed by the processor chipset. The processor chipset can include one or more cores, one or more caches, a memory controller (e.g., controller 116) (e.g., NVDIMM controller), and a storage protocol controller (e.g., PCIe controller, SATA controller). The host system 120 uses the memory sub-system 110, for example, to write data to the memory sub-system 110 and read data from the memory sub-system 110.

The host system 120 can be coupled to the memory sub-system 110 via a physical host interface. Examples of a physical host interface include, but are not limited to, a serial advanced technology attachment (SATA) interface, a peripheral component interconnect express (PCIe) interface, a universal serial bus (USB) interface, a Fibre Channel, a Serial Attached SCSI (SAS) interface, a double data rate (DDR) memory bus interface, a Small Computer System Interface (SCSI), a dual in-line memory module (DIMM) interface (e.g., DIMM socket interface that supports Double Data Rate (DDR)), an Open NAND Flash Interface (ONFI), a Double Data Rate (DDR) interface, a Low Power Double Data Rate (LPDDR) interface, or any other interface. The physical host interface can be used to transmit data between the host system 120 and the memory sub-system 110. The host system 120 can further utilize an NVM Express (NVMe) interface to access components (e.g., memory devices 130) when the memory sub-system 110 is coupled with the host system 120 by the PCIe interface. The physical host interface can provide an interface for passing control, address, data, and other signals between the memory sub-system 110 and the host system 120. FIG. 1 illustrates a memory sub-system 110 as an example. In general, the host system 120 can access multiple memory sub-systems via a same communication connection, multiple separate communication connections, and/or a combination of communication connections.

The processing device 118 of the host system 120 can be, for example, a microprocessor, a central processing unit (CPU), a processing core of a processor, an execution unit, etc. In some instances, the controller 116 can be referred to as a memory controller, a memory management unit, and/or an initiator. In one example, the controller 116 controls the communications over a bus coupled between the host system 120 and the memory sub-system 110. In general, the controller 116 can send commands or requests to the memory sub-system 110 for desired access to memory devices 130, 140. The controller 116 can further include interface circuitry to communicate with the memory sub-system 110.

The interface circuitry can convert responses received from the memory sub-system 110 into information for the host system 120.

The controller 116 of the host system 120 can communicate with the controller 115 of the memory sub-system 110 to perform operations such as reading data, writing data, or erasing data at the memory devices 130, 140 and other such operations. In some instances, the controller 116 is integrated within the same package of the processing device 118. In other instances, the controller 116 is separate from the package of the processing device 118. The controller 116 and/or the processing device 118 can include hardware such as one or more integrated circuits (ICs) and/or discrete components, a buffer memory, a cache memory, or a combination thereof. The controller 116 and/or the processing device 118 can be a microcontroller, special purpose logic circuitry (e.g., a field programmable gate array (FPGA), an application specific integrated circuit (ASIC), etc.), or another suitable processor.

The memory devices 130, 140 can include any combination of the different types of non-volatile memory components and/or volatile memory components. The volatile memory devices (e.g., memory device 140) can be, but are not limited to, random access memory (RAM), such as dynamic random access memory (DRAM) and synchronous dynamic random access memory (SDRAM).

Some examples of non-volatile memory components include a negative-and (or, NOT AND) (NAND) type flash memory and write-in-place memory, such as three-dimensional cross-point (□3D cross-point□) memory. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Each of the memory devices 130 can include one or more arrays of memory cells. One type of memory cell, for example, single level cells (SLC) can store one bit per cell. Other types of memory cells, such as multi-level cells (MLCs), triple level cells (TLCs), quad-level cells (QLCs), and penta-level cells (PLCs) can store multiple bits per cell. In some embodiments, each of the memory devices 130 can include one or more arrays of memory cells such as SLCs, MLCs, TLCs, QLCs, PLCs, or any combination of such. In some embodiments, a particular memory device can include an SLC portion, an MLC portion, a TLC portion, a QLC portion, and/or a PLC portion of memory cells. The memory cells of the memory devices 130 can be grouped as pages that can refer to a logical unit of the memory device used to store data. With some types of memory (e.g., NAND), pages can be grouped to form blocks.

Although non-volatile memory devices such as 3D cross-point type and NAND type memory (e.g., 2D NAND, 3D NAND) are described, the memory device 130 can be based on any other type of non-volatile memory, such as read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), negative-or (NOR) flash memory, and electrically erasable programmable read-only memory (EEPROM).

A memory sub-system controller 115 (or controller 115 for simplicity) can communicate with the memory devices 130 to perform operations such as reading data, writing data, or erasing data at the memory devices 130 and other such operations (e.g., in response to commands scheduled on a command bus by controller 116). The controller 115 can include hardware such as one or more integrated circuits (ICs) and/or discrete components, a buffer memory, or a combination thereof. The hardware can include digital circuitry with dedicated (i.e., hard-coded) logic to perform the operations described herein. The controller 115 can be a microcontroller, special purpose logic circuitry (e.g., a field programmable gate array (FPGA), an application specific integrated circuit (ASIC), etc.), or another suitable processor.

The controller 115 can include a processing device 117 (processor) configured to execute instructions stored in a local memory 119. In the illustrated example, the local memory 119 of the controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, etc. The local memory 119 can also include read-only memory (ROM) for storing micro-code. While the example memory sub-system 110 in FIG. 1 has been illustrated as including the controller 115, in another embodiment of the present disclosure, a memory sub-system 110 does not include a controller 115, and can instead rely upon external control (e.g., provided by an external host, or by a processor or controller separate from the memory sub-system).

In general, the controller 115 can receive commands or operations from the host system 120 and can convert the commands or operations into instructions or appropriate commands to achieve the desired access to the memory devices 130. The controller 115 can be responsible for other operations such as wear leveling operations, garbage collection operations, error detection and error-correcting code (ECC) operations, encryption operations, caching operations, and address translations between a logical address (e.g., logical block address (LBA), namespace) and a physical address (e.g., physical block address) that are associated with the memory devices 130. The controller 115 can further include host interface circuitry to communicate with the host system 120 via the physical host interface. The host interface circuitry can convert the commands received from the host system into command instructions to access the memory devices 130 as well as convert responses associated with the memory devices 130 into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the controller 115 and decode the address to access the memory devices 130.

In some embodiments, the memory devices 130 include local media controllers 150 that operate in conjunction with the memory sub-system controller 115 to execute operations on one or more memory cells of the memory devices 130. An external controller (e.g., memory sub-system controller 115) can externally manage the memory device 130 (e.g., perform media management operations on the memory device 130). In some embodiments, a memory device 130 is a managed memory device, which is a raw memory device combined with a local controller (e.g., local media controller 150) for media management within the same memory device package. An example of a managed memory device is a managed NAND (MNAND) device.

The controller 115 and/or a memory device 130 can include an error correction manager 113 configured to use known data or a known data pattern to improve error correction that is based on an Error Correct Code (ECC) of a predetermined code rate. In some embodiments, the controller 115 in the memory sub-system 110 includes at least a portion of the error correction manager 113. In other embodiments, or in combination, the controller 116 and/or the processing device 118 in the host system 120 includes at least a portion of the error correction manager 113. For example, the controller 115, the controller 116, and/or the processing device 118 can include logic circuitry implementing the error correction manager 113. For example, the controller 115, or the processing device 118 (processor) of the host system 120, can be configured to execute instructions stored in memory for performing the operations of the error correction manager 113 described herein. In some embodiments, the error correction manager 113 is implemented in an integrated circuit chip disposed in the memory sub-system 110. In other embodiments, the error correction manager 113 can be part of firmware of the memory sub-system 110, an operating system of the host system 120, a device driver, or an application, or any combination therein.

For example, the error correction manager 113 implemented in the controller 115 can combine a user data item and known data (or a known data pattern) to generate redundant data to be stored in a memory device that uses an Error Correction Code (ECC) of a predetermined code rate. The known data is not stored. Thus, combinations of different user data items and their respective redundant data can be distributed for programming into a group of memory cells without leaving any of the memory cells unprogrammed, or programmed to store known data. Thus, the utilization of the group of memory cells is maximized with improved error correction capability for recovering errors in reading the programmed memory cells.

Since the redundant data stored in the memory device is based on the user data item and known data (or the known data pattern), and the known data can be regenerate without reading the memory cells, it is not necessary for the Error Correction Code to detect the random errors in the known data. This allows the decoder having the predetermined code rate to recover more random bit errors in the redundant data and the user item. Thus, when the effective error rate for the remaining errors in the redundant data and the user data item is less than the error correction capability of the Error Correction Code (ECC) of the predetermined code rate, the Error Correction Code (ECC) can detect and correct the remaining errors to provide an error free version of the user data. Thus, the use of the known data (or the known data pattern) effectively improves the error correction capability of the Error Correction Code (ECC) in recovering the user data. From another point of view, introducing the known data pattern, the ratio of ECC redundant data relative to user data is increased, which increases the error correct capability of the codeword beyond the predetermined capability in correcting data having no known pattern. As result, the memory device can tolerate more errors within the user data portion in comparison with storing data having no known pattern.

The known data (or the known data pattern) can be recovered without reading the memory cells. Thus, it is not necessary to store the known data into the memory cells in the memory device. The user data items and their respective redundant data can be reorganized and programmed into memory cells to best utilize the storage capacity of the memory cells without storing the known data or reserving unused portion of the memory cells to represent the known data.

Figure 2:
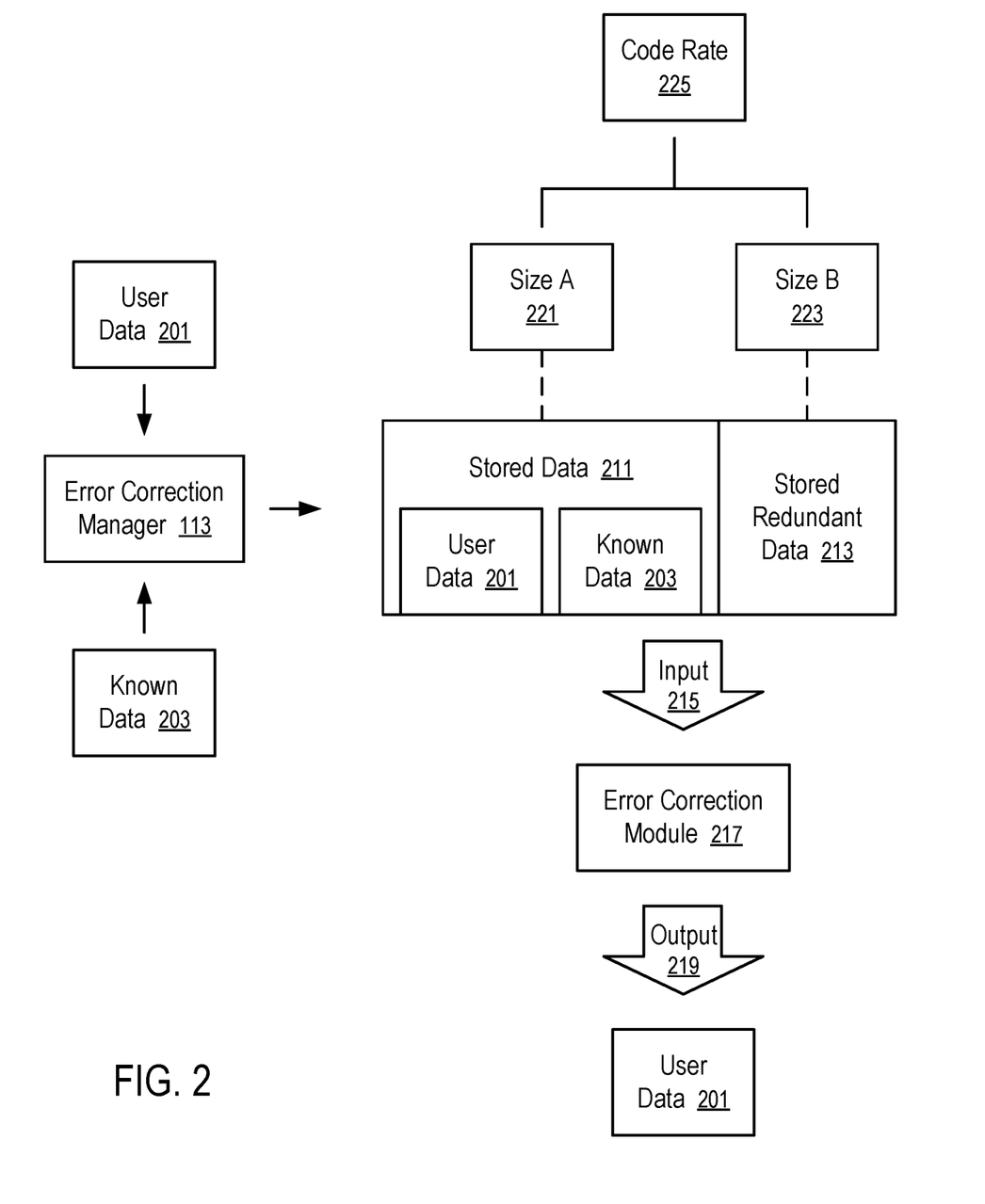
FIG. 2 shows a technique to improve capability of error correction for stored data using a memory device having a predetermined rate of error correction code according to one embodiment.

FIG. 2 shows a technique to improve capability of error correction for stored data using a memory device having a predetermined rate of error correction code according to one embodiment.

For example, the technique of FIG. 2 can be implemented in the memory sub-system 110 through the operations performed by the error correction manager 113.

In FIG. 2, an error correction module 217 is configured to operate using an Error Correction Code (ECC) having a predefined code rate 225. The code rate 225 is the ratio between the size 221 of stored data 211 and the sum of the size 221 and the size 223 of stored redundant data 213.

For example, the stored redundant data 213 can include parity bits of selected subsets of bits in the stored data 211, such as in a Low-Density Parity-Check (LDPC) code.

For example, the set of data, including the stored data 211 and the stored redundant data 213, can be stored in a set of memory cells by programming the threshold voltages of the memory cells. Different combinations of threshold voltages of the memory cells represent different bit values in the set of data. To retrieve the set of data from the memory cells, the threshold voltages of the memory cells are checked to determine the bit values of the stored data 211 and the stored redundant data 213.

There can be random errors in the bits of the stored data 211 and the stored redundant data 213 in the checking of the threshold voltages of the memory cells. When the number of errors in the bits of the stored data 211 and the stored redundant data 213 is low, the error correction module 217 can detect and correct the errors.

In FIG. 2, known data 203 is used as part of the stored data 211 to reduce the bit error rate in the bits of the user data 201 and stored redundant data 213 to be corrected by the Error Correction Code (ECC). For example, all of the bits in the known data 203 can be configured to have a predetermined value (e.g., one or zero). Alternatively, the bits in the known data 203 can be configured to have a predetermined value pattern. Thus, errors in the bits of a version of the known data 203 obtained from a read operation can be corrected to generate an input 215 without relying upon the error correction module 217. Once the errors in the bits of the version of the known data 203 from the read operation is corrected, the total number of bit errors in the input 215 to the error correction module 217 is reduced. Increased ECC to User ratio achieves larger error correction capability and can tolerate more read bit error rate (RBER). From another point of view, reducing the bit errors in the input 215 increases the success rate of the error correction module 217 in correcting all of the remaining errors to recover an error-free version of the user data 201 in the output 219 of the error correction module 217.

For example, the number of bits in the known data 203 can be configured to be the same as the sum of bits in the user data 201 and the stored redundant data 213. Since the bit errors are randomly distributed across the stored data 211 and the stored redundant data 213, one half of the bit errors is expected to be in the known data 203; and the other half of the bit errors is expected to be in the user data 201 and the stored redundant data 213. After correcting the bit errors in the known data 203, the bit error rate in the stored data 211 and the redundant data 213 is effectively reduced by half, which effectively increases the error correction capability of the error correction module 217 in recovering the user data 201 without error.

For example, without using the known data 203 as part of the stored data 211, the error correction module 217 can fail to reliably correct bit errors in the stored data 211 after the bit error rate reaches a threshold after a number of program/erasure cycles. However, at the loss of half of the user bits as an example, the emulated ECC to User byte is doubled up; and it improves the RBER correction capability of Error Correction Module. For example, when the error correction manager 113 combines the user data 201 and known data 203 to generate the stored data 211, the error correction module 217 can reliably correct errors in the user data 201 when the bit error rate in the stored data 211 and the stored redundant data 213 is higher than the threshold but lower than twice the threshold. Thus, the user life of the set of memory cells can be extended beyond the number of program/erasure cycles until the bit error rate in the memory cells reaches twice the threshold.

In another example, the number of bits of the known data 203 is one third of the bits in the stored data 211 and the stored redundant data 213. Thus, correcting the errors in the known data 203 can remove the errors in the data bits determined from the states of the memory cells, increase ECC to user data ratio, and the error correction capability for the user data 201.

The technique of FIG. 2 can also be used to improve the reliability of recovering the user data 201. By reducing the bit error rate through correcting the bit errors in the known data 203, the likelihood of the error correction module 217 failing to correct the remaining errors in the user data 201 is reduced due to increased error correction capability for the user data resulting from an increased ratio between ECC data and user data. Thus, the use of the known data 203 as part of the stored data can be used to protect the user data 201 that needs extra protection for reliable recovery.

Figure 3:
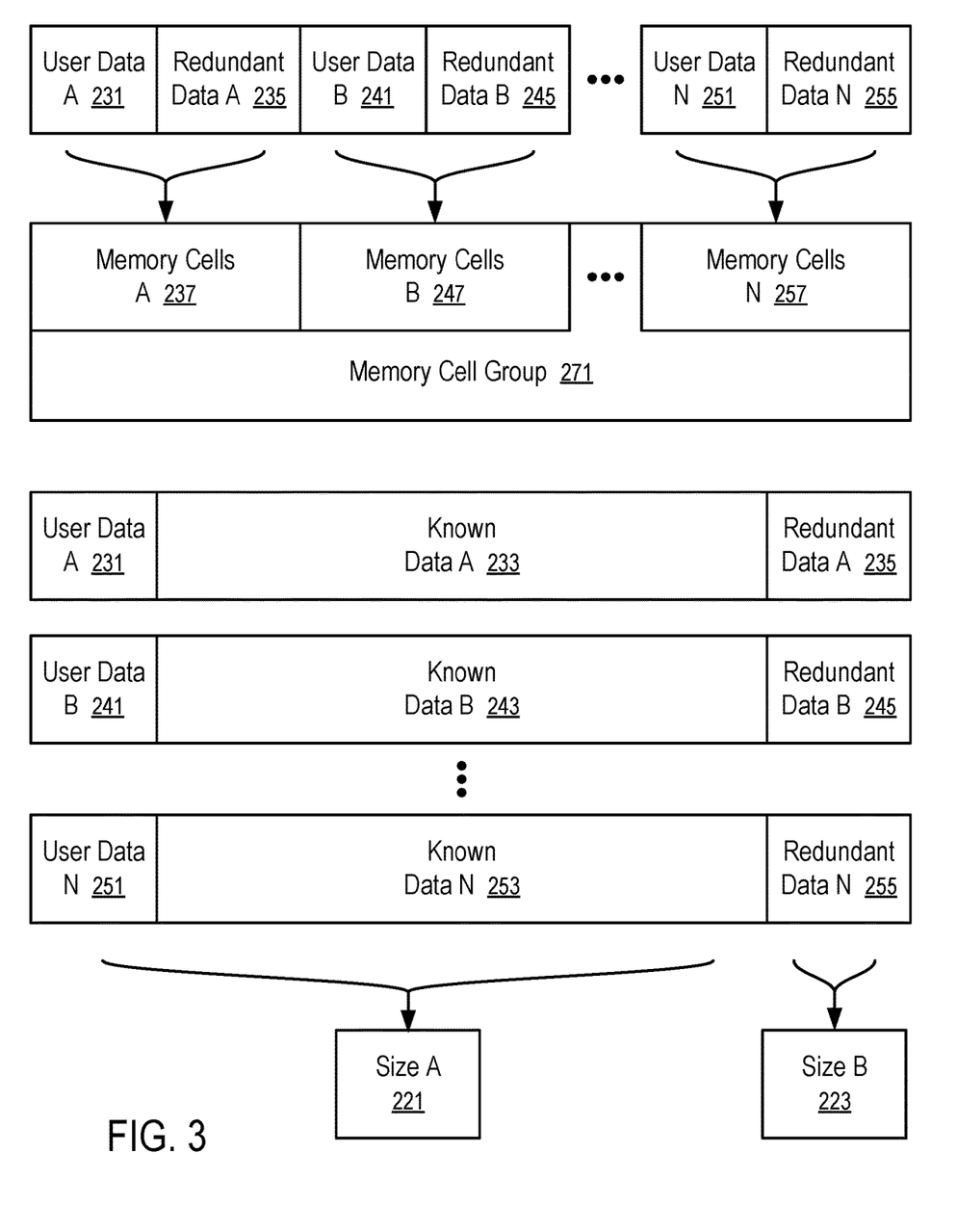
FIG. 3 shows a technique to store data in a group of memory cells with improved error correction for error correction decoding using a predetermined code rate according to one embodiment.

FIG. 3 shows a technique to store data in a group of memory cells with improved error correction for error correction decoding using a predetermined code rate according to one embodiment.

For example, the technique of FIG. 3 can be implemented in the memory sub-system 110 through the operations performed by the error correction manager 113.

For example, the technique of FIG. 3 can be used in combination with the technique of FIG. 2 but without actually storing the known data 203 in the memory cells of a memory device 130 of a memory sub-system 110 of FIG. 1.

In FIG. 3, a memory cell group 271 has a plurality of portions of storage capacity (e.g., memory cells 237, 247, . . . , 257). For example, memory cells 237 represent a portion of the storage capacity of the memory cell group 271; memory cells 247 represent another portion of the storage capacity of the memory cell group 271; and memory cells 247 represent a further portion of the storage capacity of the memory cell group 271. Thus, in general, it is not necessary to program the different pieces of user data 231, 241, . . . , 251 into separate subsets of memory cells in the group 271.

For each piece of user data (e.g., 231, 241, or 251), a corresponding piece of redundant data (e.g., 235, 245, . . . , 255) is also stored in the memory cell group 271. In general, any scheme can be used to arrange the combination of user data (e.g., 231, 241, . . . , 251) and redundant data (e.g., 235, 245, . . . , 255) for programming into the storage capacity of the memory cell group 271. Thus, it is not necessarily to program different groups of user data and redundant data (e.g., a group of user data 231 and redundant data 235) into different groups of memory cells (e.g., a group of memory cells 237), as in the example illustrated in FIG. 3.

In FIG. 3, the each piece of redundant data (e.g., 235, 245, or 255) is generated from not only the corresponding piece of user data (e.g., 231, 241, or 251), but also a corresponding piece of known data (e.g., 233, 243, or 253) that is not stored in the memory cell group 271. For example, the redundant data 235 is generated according to the predetermined code rate 225 from a collection of the user data 231 and the known data 233 (e.g., generated in a way as in FIG. 2). Similarly, the redundant data 245 is generate according to the predetermined code rate 225 from a collection of the user data 241 and the known data 243; and the redundant data 255 is generate according to the predetermined code rate 225 from a collection of the user data 251 and the known data 253.

The predetermined code rate 225 determines the ratio between the size 223 of redundant data (e.g., 235) and the size 221 of the collection of the user data (e.g., 231) and the known data (e.g., 233), from which collection the redundant data (e.g., 235) is generated according to the Error Correction Code (ECC) of the predetermined code rate 225.

In general, the sizes of the different pieces of user data 231, 241, . . . 251 do not have to be the same. The ratio between a piece of user data 231 and its corresponding redundant data 235 determines the error correction capability of the Error Correction Code (ECC) of the predetermined code rate 225 in decoding the set of user data 231, the known data 233 without errors, and the redundant data 235, which can be higher than decoding a data set of the same size but has random bit errors across the entire data set.

Optionally, the bits of the user data 231 and the bits of the known data 233 can be interleaved (e.g., according to a known arrangement/scheme) for generation of the input data for the encoder of the Error Correction Code (ECC) having the predetermined code rate 225 to generate the redundant data 235.

In general, the known data 233, 243, . . . , 253 for different user data 231, 241, . . . , 251 can be the same or different. The known data 233, 243, . . . , 253 can be configured to be independent of what is stored in the memory cell group 271, such that the exact known data 233, 243, . . . , 253 can be regenerated for the user data 231, 241, . . . , 251 without reading the memory cell group 271. For example, the known data 233, 243, . . . , 253 can have a predetermined bit pattern (e.g., all zeros, all ones, or another predetermined pattern of zeros and ones). For example, the known data 233 can be determined from the representative memory addresses of the user data 231, 241, . . . , 251; and the known data 233 can be managed by the Error Correction Manage 113 (e.g., implemented as part of firmware) using an optional look-up table, avoiding the need for writing the various patterns of the known data 233 into the memory cell group 271. For example, the known data 233, 243, . . . , 253 can be dependent on a configuration parameter that can be changed to randomize the bit data patterns in the known data 233, 243, . . . , 253.

In FIG. 3, none of the known data (e.g., 233, 243, . . . , 253) is programmed into the memory cell group 271; and no portion of the storage capacity is reserved to represent the known data (e.g., 233, 243, . . . , 253). Thus, the entire storage capacity of the memory cell group 271 is used to store the user data 231, 241, . . . , 251, and their respective redundant data 235, 245, . . . , 255.

To retrieve an error free version of the user data (e.g., 231) from the memory cell group 271, the memory device (e.g., 130) can read the states of memory cells (e.g., 237) in the memory cell groups 271. The states represent a raw version of the user data (e.g., 231) and the corresponding redundant data (e.g., 235) as retrieved from the memory cell group 271. The raw version as retrieved can have random bit errors.

To determine and recovery from the random bit errors in the raw version of retrieved data, the error correction manager 113 (e.g., in the memory device 130 and/or the memory sub-system controller 115) can regenerate the corresponding known data (e.g., 233) and use the error correction module 217 to decode the raw version of retrieved data. The known data (e.g., 233) can be regenerated based on a predetermined bit pattern, a data pattern represented by a memory address of the memory cells (e.g., 237), and/or other data that is not dependent on the states of the memory cells (e.g., 237). Thus, the known data (e.g., 233) can be generated for the user data (e.g., 231) without errors and without reading the memory cells (e.g., 237) and/or the memory cell group 271.

Since the regenerated known data 233 contains no bit errors, the input data to the error correction module 217 contains random bit errors only in the user data 231 and the redundant data 235 as in the raw version of retrieved data. When the error correction module 217 receives such an input, including the user data 231 determined from the states of the memory cells 237, the known data 233 regenerated independent from the states of memory cells 237 and having not errors, and the corresponding redundant data 235 determined from the states of the memory cells 237, the error correction module 217 can identify the random bit errors in the input.

The ratio between the redundant data 235 and the combination of the user data 231, the known data 233, and the redundant data 235 satisfies the code rate of the error correction module 217. Since the known data 233 contains no error, the error correction decoder (e.g., module 217) can successfully decode the input with a bit error rate for errors limited in the user data 231 and the redundant data 235 higher than for the bit error rate for random bit errors in the entire input (e.g., not only in the user data 231 and the redundant data 235 but also in the known data 233). As a result, the error correction module 217 having the predetermined code rate 225 has an improved error correction capability to recover from errors in the memory cells 237 (or the corresponding portion of the storage capacity of the memory cell group 271 used to store the user data 231 and the redundant data 235). The improved error correction capability is higher than the capability to recover from errors for data stored in the same memory cells 237 (or the corresponding portion of storage capacity) without using known data. The improved error correction capability, resulting from the use of known data 233, allows the extension of the useful life of the memory cell group 271 and/or improved reliability of the memory cell group 271 in storing data.

In one implementation, the entire storage capacity of the memory cell group 271 is equal to the amount of data of one set of user data (e.g., 231), and its known data (e.g., 233) and redundant (e.g., 235). When a conventional technique is used to store data in the memory cell group 271, the storage capacity corresponding to the combination of the user data 231 and the known data 233 is used to store an amount of independent user data protected via the redundant data generated according to the Error Correction Code of the predetermined code rate 225. The use of the storage capacity corresponding to the known data 233 to store additional user data allows the memory cell group 271 to store more data for the user, but the presence of bit errors in the corresponding storage capacity limits the error correction capability of the error correction decoder (e.g., error correction module 217). When the known data 233 is used, the error correction capability is improved for recovering the errors in user data 231 and the redundant data 235, since there is no error in the known data 233. Since the memory cell group 271 is not used to store the known data 233, the correspond storage capacity that would be used to store the known data 233 can be used to store other sets of user data (e.g., 241, . . . , 251) and their redundant data (e.g., 245, . . . , 255).

In comparison with the conventional technique, the memory cell group 271 uses the storage capacity corresponding to the known data 233 to store user data 241, . . . , 251, as well as redundant data 245, . . . , 255. The increased amount of redundant data 245, . . . , 255 over the redundant data 235 represented by the predetermined code rate 225 improves the error correction capability in decoding the user data 231, 241, . . . , 251 as a whole, but reduces the storage capacity for the user (since a portion of the storage capacity is used to store the extra redundant data 245, . . . , 255 for improved error correction capability).

Figure 4:
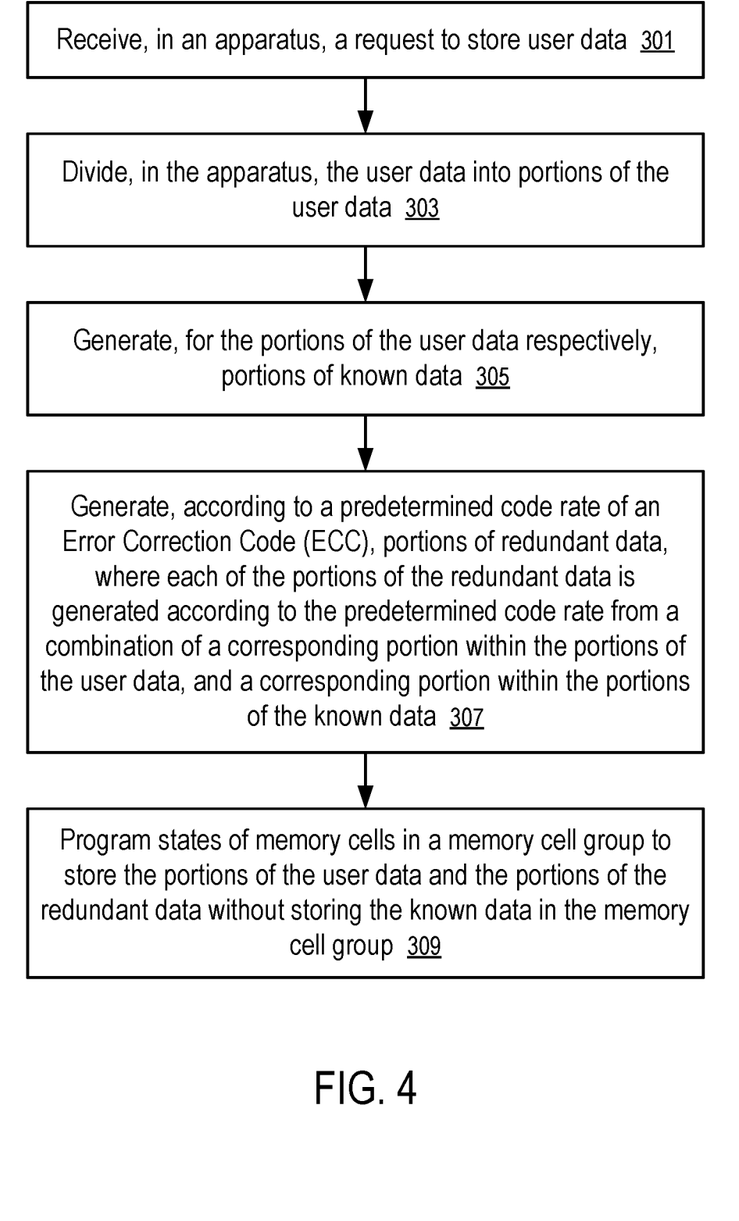
FIG. 4 shows a method to store data in a group of memory cells according to one embodiment.

FIG. 4 shows a method to store data in a group of memory cells according to one embodiment. The method of FIG. 4 can be performed by processing logic that can include hardware (e.g., processing device, circuitry, dedicated logic, programmable logic, microcode, hardware of a device, integrated circuit, etc.), software/firmware (e.g., instructions run or executed on a processing device), or a combination thereof. In some embodiments, the method of FIG. 4 is performed at least in part by the controller 115 and/or the local media controller 150 of the memory sub-system 110 in FIG. 1, and/or by the processing device 118 of the host system 120. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

For example, the method of FIG. 4 can be implemented via operations performed by an error correction manager 113 in the memory sub-system controller 115 and/or in the local media controller 150 using the techniques of FIG. 2 and/or FIG. 3.

At block 301, an apparatus (e.g., a memory sub-system 110 and/or a memory device 130) receives a request to store user data 201.

At block 303, the apparatus divides the user data 201 into portions of the user data (e.g., 231, 241, . . . , 251).

At block 305, the apparatus generates, for the portions of the user data (e.g., 231, 241, . . . , 251) respectively, portions of known data (e.g., 233, 243, . . . , 253).

For example, the known data (e.g., 233, 243, . . . , 253) can have a predetermined value or bit pattern. The known data (e.g., 233, 243, . . . , 253) can be configured to be identifiable for the user data (e.g., 231, 241, . . . , 251) stored in the memory cell group 271 without reading the states of memory cells (e.g., 237, 247, . . . , 257) in the memory cell group 271.

At block 307, the apparatus generates, according to a predetermined code rate 225 of an Error Correction Code (ECC), portions of redundant data (e.g., 235, 245, . . . , 255). Each of the portions of the redundant data (e.g., 235) is generated according to the predetermined code rate 225 from a combination of a corresponding portion (e.g., user data 231) within the portions of the user data, and a corresponding portion (e.g., known data 233) within the portions of the known data.

For example, the Error Correction Code (ECC) is a Low-Density Parity-Check (LDPC) code; and the redundant data (e.g., 235, 245, . . . , 255) includes parity data generated from the known data (e.g., 233, 243, . . . , 253) and the user data (e.g., 231, 241, . . . , 251) according to the Low-Density Parity-Check (LDPC) code.

At block 309, the apparatus programs states of memory cells (e.g., 237, 247, . . . , 257) in a memory cell group 271 to store the portions of the user data (e.g., 231, 241, . . . , 251) and the portions of the redundant data (e.g., 235, 245, . . . , 255) without storing the known data (e.g., 233, 243, . . . , 253) in the memory cell group 271.

For example, a storage capacity of the memory cell group 271 can be equal to a sum of a first data size of one of the portions of the user data (e.g., 231), a second data size of one of the portions of the known data (e.g., 233), and a third data size of one of the portions of the redundant data (e.g., 235). However, since the known data (e.g., 233, 243, . . . , 253) are not stored in the memory cell group 271, the memory cell group 271 has sufficient storage capacity to store other portions of user data (e.g., 241, . . . , 251) and corresponding portions of redundant data (e.g., 245, . . . , 255).

Optionally, the portions of the user data (e.g., 231, 241, . . . , 251) can be configured to have a same size. Alternatively, some portions of the user data (e.g., 231 and 241) can have different sizes. The error correction module 217 can have a better error correction capability for a smaller size user data than a larger size user data when they are padded with respective known data to generate the same size of redundant data according to the Error Correction Code (ECC) of the predetermined code rate 225.

The predetermined code rate 225 corresponds to a predefined capability of a decoder of Error Correction Code (ECC) of the apparatus (e.g., error correction module 217) in decoding an input data set having random bit errors distributed across the entire input data set. The use of the known data (e.g., 233, 243, . . . , 253) without errors and the redundant data (e.g., 235, 245, . . . , 255) of the predetermined code rate 225 can increase the capability of the decoder in successfully decoding the user data (e.g., 231, 241, . . . , 251) and the redundant data (e.g., 235, 245, . . . , 255) that are only part of the input data set to the decoder.

Figure 5:
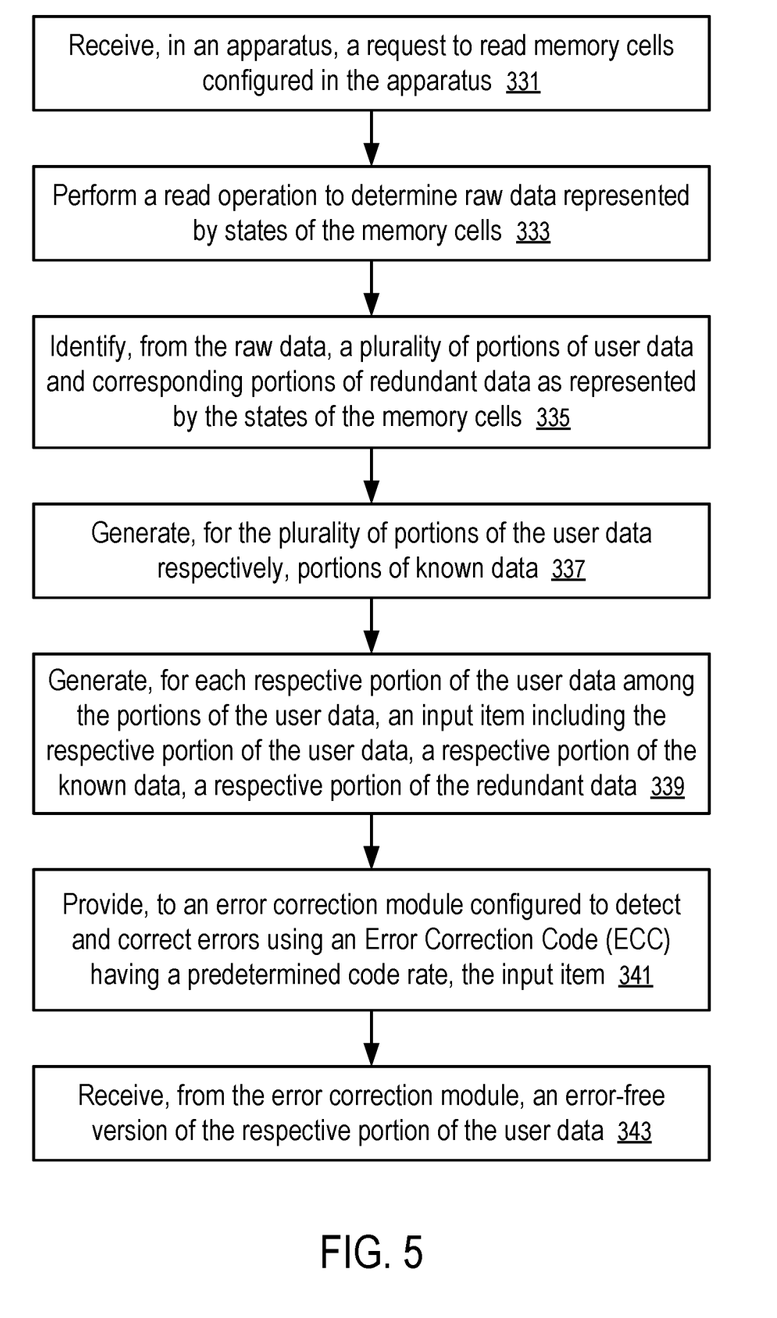
FIG. 5 shows a method to retrieve data from a group of memory cells according to one embodiment.

FIG. 5 shows a method to retrieve data from a group of memory cells according to one embodiment. The method of FIG. 54 can be performed by processing logic that can include hardware (e.g., processing device, circuitry, dedicated logic, programmable logic, microcode, hardware of a device, integrated circuit, etc.), software/firmware (e.g., instructions run or executed on a processing device), or a combination thereof. In some embodiments, the method of FIG. 5 is performed at least in part by the controller 115 and/or the local media controller 150 of the memory subsystem 110 in FIG. 1, and/or by the processing device 118 of the host system 120. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

For example, the method of FIG. 5 can be implemented via operations performed by an error correction manager 113 in the memory sub-system controller 115 and/or in the local media controller 150 using the technique of FIG. 2 and/or FIG. 3.

For example, data stored in a memory cell group 271 according to the method of FIG. 4 can be retrieved using the method of FIG. 5.

At block 331, an apparatus (e.g., a memory sub-system 110 and/or a memory device 130) receives a request to read memory cells (e.g., 237, 247, . . . , 257) configured in the apparatus.

At block 333, the apparatus performs a read operation to determine raw data represented by states of the memory cells (e.g., 237, 247, . . . , 257).

At block 335, the apparatus identifies, from the raw data, a plurality of portions of user data (e.g., 231, 241, . . . , 251) and corresponding portions of redundant data (e.g., 235, 245, . . . , 255) as represented by the states of the memory cells (e.g., 237, 247, . . . , 257).

At block 337, the apparatus generates, for the plurality of portions of the user data (e.g., 231, 241, . . . , 251) respectively, portions of known data (e.g., 233, 243, . . . , 253).

The known data (e.g., 233, 243, . . . , 253) is independent of the states of the memory cells (e.g., 237, 247, . . . , 257) and thus can be determined without reading the memory cells (e.g., 237, 247, . . . , 257).

Optionally, the known data (e.g., 233, 243, . . . , 253) is based on a memory address of the memory cells and/or another data item that is not stored in the memory cell group 271.

At block 339, the apparatus generates, for each respective portion of the user data (e.g., 231) among the portions of the user data (e.g., 231, 241, . . . , 251), an input item including the respective portion of the user data (e.g., 231), a respective portion of the known data (e.g., 233), a respective portion of the redundant data (e.g., 235).

Optionally, a number of bits of the input item is configured to be equal to a number of bits of the raw data; and the portions of the user data (e.g., 231, 241, . . . , 251) can optionally be configured to have a same size.

Since the storage capacity of the memory cells (e.g., 237, 247, . . . , 257) does not include a portion for the known data (e.g., 233, 243, . . . , 253), a plurality of input items corresponding to the plurality of portions of user data (e.g., 231, 241, . . . , 251) can be stored in and retrieved from the memory cells (e.g., 237, 247, . . . , 257).

At block 341, the apparatus provides the input item to an error correction module 217 that is configured to detect and correct errors using an Error Correction Code (ECC) having a predetermined code rate.

For example, the Error Correction Code (ECC) is a Low-Density Parity-Check (LDPC) code; and the redundant data 235, 245, . . . , 255 includes parity data generated according to the Low-Density Parity-Check (LDPC) code.

A ratio between a number of bits of the respective portion of the redundant data and a number of bits of the input item is represented/determined by the predetermined code rate.

At block 343, the apparatus receives, from the error correction module 217, an error-free version of the respective portion of the user data (e.g., 231).

Since the input item has no random bit errors in the portion corresponding to the known data (e.g., 233), the ability of the error correction module 217 in detecting and correcting random bits errors in the remaining portion of the input item corresponding to the user data (e.g., 231) and the redundant data (e.g., 235) is increased.

Figure 6:
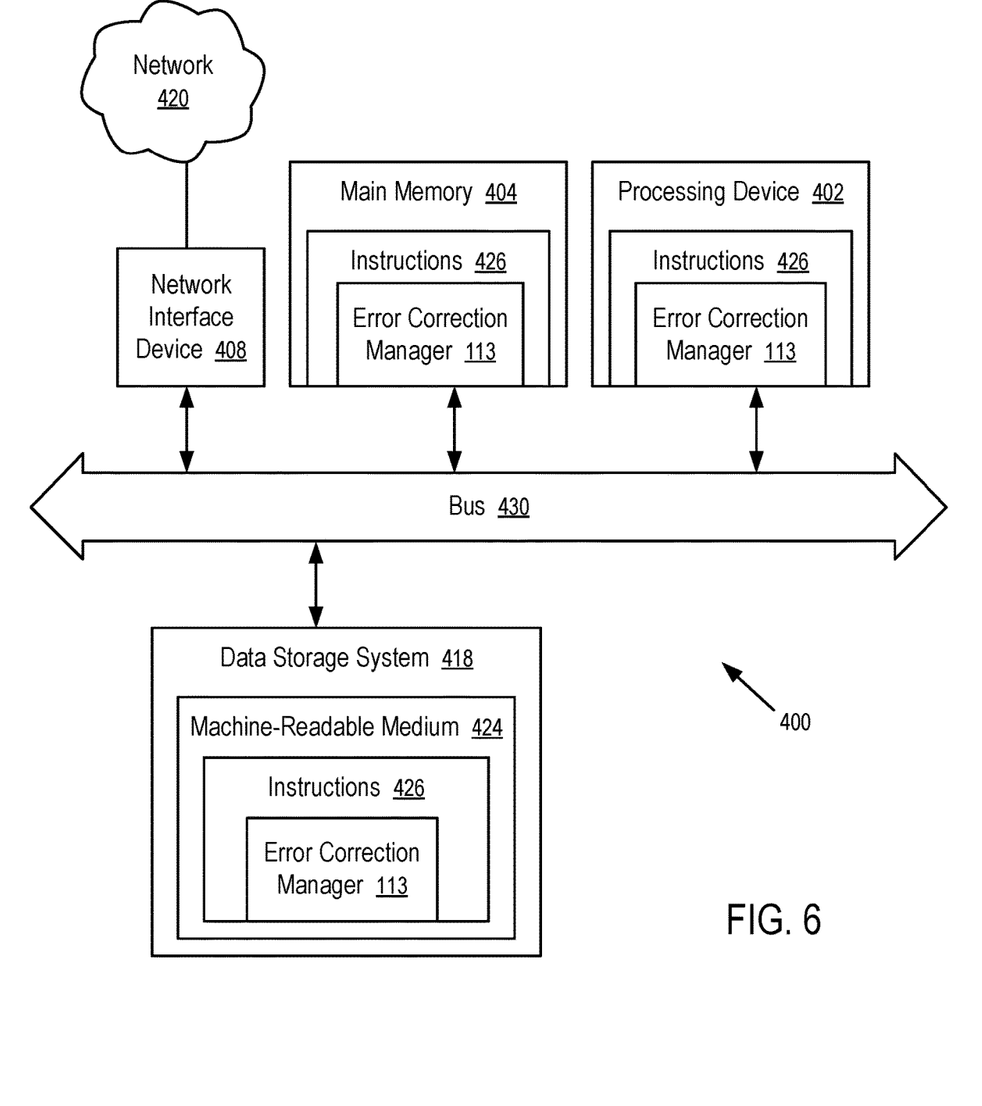
FIG. 6 is a block diagram of an example computer system in which embodiments of the present disclosure can operate.

FIG. 6 illustrates an example machine of a computer system 400 within which a set of instructions, for causing the machine to perform any one or more of the methodologies discussed herein, can be executed. In some embodiments, the computer system 400 can correspond to a host system (e.g., the host system 120 of FIG. 1) that includes, is coupled to, or utilizes a memory sub-system (e.g., the memory sub-system 110 of FIG. 1) or can be used to perform the operations of an error correction manager 113 (e.g., to execute instructions to perform operations corresponding to the error correction manager 113 described with reference to FIGS. 1-5). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term □machine□ shall also be taken to include any collection of machines that individually or jointly execute a set (or multiple sets) of instructions to perform any one or more of the methodologies discussed herein.

The example computer system 400 includes a processing device 402, a main memory 404 (e.g., read-only memory (ROM), flash memory, dynamic random access memory (DRAM) such as synchronous DRAM (SDRAM) or Rambus DRAM (RDRAM), static random access memory (SRAM), etc.), and a data storage system 418, which communicate with each other via a bus 430 (which can include multiple buses).

Processing device 402 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 402 can also be one or more special-purpose processing devices such as an application specific integrated circuit (ASIC), a field programmable gate array (FPGA), a digital signal processor (DSP), network processor, or the like. The processing device 402 is configured to execute instructions 426 for performing the operations and steps discussed herein. The computer system 400 can further include a network interface device 408 to communicate over the network 420.

The data storage system 418 can include a machine-readable medium 424 (also known as a computer-readable medium) on which is stored one or more sets of instructions 426 or software embodying any one or more of the methodologies or functions described herein. The instructions 426 can also reside, completely or at least partially, within the main memory 404 and/or within the processing device 402 during execution thereof by the computer system 400, the main memory 404 and the processing device 402 also constituting machine-readable storage media. The machine-readable medium 424, data storage system 418, and/or main memory 404 can correspond to the memory sub-system 110 of FIG. 1.

In one embodiment, the instructions 426 include instructions to implement functionality corresponding to an error correction manager 113 (e.g., the error correction manager 113 described with reference to FIGS. 1-5). While the machine-readable medium 424 is shown in an example embodiment to be a single medium, the term □machine-readable storage medium□ should be taken to include a single medium or multiple media that store the one or more sets of instructions. The term □machine-readable storage medium□ shall also be taken to include any medium that is capable of storing or encoding a set of instructions for execution by the machine and that cause the machine to perform any one or more of the methodologies of the present disclosure. The term □machine-readable storage medium□ shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system□s registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory (□ROM□), random access memory (□RAM□), magnetic disk storage media, optical storage media, flash memory components, etc.

In this description, various functions and operations are described as being performed by or caused by computer instructions to simplify description. However, those skilled in the art will recognize what is meant by such expressions is that the functions result from execution of the computer instructions by one or more controllers or processors, such as a microprocessor. Alternatively, or in combination, the functions and operations can be implemented using special purpose circuitry, with or without software instructions, such as using Application-Specific Integrated Circuit (ASIC) or Field-Programmable Gate Array (FPGA). Embodiments can be implemented using hardwired circuitry without software instructions, or in combination with software instructions. Thus, the techniques are limited neither to any specific combination of hardware circuitry and software, nor to any particular source for the instructions executed by the data processing system.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A method, comprising:
receiving, in an apparatus having a group of memory cells divided into a plurality of segments, a request to store user data;
dividing, in the apparatus and based on an indication of a bit error rate of the memory cells, the user data into portions of the user data;
generating, for the portions of the user data respectively, portions of known data;
generating, according to a predetermined code rate of an Error Correction Code (ECC), portions of redundant data, wherein the predetermined code rate specifies a ratio between a first size of given data and a second size of one codeword of the Error Correction Code (ECC) representing the given data of the first size, wherein the codeword consists of the given data and redundant information generated according to the Error Correction Code (ECC) from the given data, wherein a storage capacity of the group of memory cells is equal to the second size of one codeword, and wherein each of the portions of the redundant data is generated according to the predetermined code rate of the Error Correction code (ECC) from a combination of:
a corresponding portion within the portions of the user data, and
a corresponding portion within the portions of the known data, wherein the combination has a size equal to the first size; and
programming states of memory cells in each segment among the plurality of segments to store a first respective portion among the portions of the user data and a second respective portion among the portions of the redundant data without storing the known data in the group of memory cells.

2. The method of claim 1, wherein the Error Correction Code (ECC) is a Low-Density Parity-Check (LDPC) code; and the redundant data comprises parity data generated from the known data and the user data according to the Low-Density Parity-Check (LDPC) code.

3. The method of claim 1, wherein the known data has a predetermined value or bit pattern.

4. The method of claim 1, wherein the known data is identifiable for the user data stored in the group of memory cells without reading states of memory cells in the group.

5. The method of claim 1, wherein the storage capacity of the group of memory cells is equal to a sum of a first data size of one of the portions of the user data, a second data size of one of the portions of the known data, and a third data size of one of the portions of the redundant data.

6. The method of claim 1, wherein the portions of the user data have a same size.

7. The method of claim 1, wherein the predetermined code rate corresponds to a capability of a decoder of Error Correction Code (ECC) of the apparatus.

8. An apparatus, comprising:
memory cells;
an error correction module configured to detect and correct errors using an Error Correction Code (ECC) having a predetermined code rate between a size of data to be encoded using the Error Correction Code (ECC) and a size of codewords representing the data using the Error Correction Code (ECC); and
a processing device configured to:
determine raw data retrieved from the memory cells according to states of the memory cells during a read operation, the memory cells having a plurality of segments, the raw data including portions of user data and portions of redundant data as represented by the states of the memory cells, each respective segment in the plurality of segments storing a first respective portion among the portions of the user data and a second respective portion among the portions of the redundant data, wherein the plurality of segments of the memory cells have a storage capacity equal to a size of one codeword consisting of given data and redundant information generated using the Error Correction Code (ECC) according to the predetermined code rate from the given data;
generate, for the portions of the user data respectively, portions of known data;
generate an input item for each respective portion of the user data among the portions of the user data, the input item including the respective portion of the user data, a respective portion of the known data, a respective portion of the redundant data, wherein the input item corresponds to a codeword encoded using the Error Correction Code (ECC) according to the predetermined code rate; and provide the input item to the error correction module to decode the input item according to the Error Correction Code (ECC) having the predetermined code rate.

9. The apparatus of claim 8, wherein the known data is independent of the states of the memory cells.

10. The apparatus of claim 8, wherein the known data has a predetermined value or bit pattern.

11. The apparatus of claim 8, wherein the Error Correction Code (ECC) is a Low-Density Parity-Check (LDPC) code; and the redundant data comprises parity data generated according to the Low-Density Parity-Check (LDPC) code.

12. The apparatus of claim 11, wherein a ratio between a number of bits of the respective portion of the redundant data and a number of bits of the input item is represented by the predetermined code rate.

13. The apparatus of claim 12, wherein the known data is generated based on a memory address of the memory cells.

14. The apparatus of claim 12, wherein a number of bits of the input item is equal to a number of bits of the raw data; and the portions of the user data have a same size.

15. A method, comprising:

receiving, in an apparatus, a request to read memory cells configured in the apparatus;

performing a read operation to determine raw data represented by states of the memory cells, the memory cells having a plurality of segments;

identifying, from the raw data, a plurality of portions of user data and corresponding portions of redundant data as represented by the states of the memory cells, each respective segment in the plurality of segments storing a first respective portion among the portions of the user data and a second respective portion among the portions of the redundant data, wherein the states of the memory cells are programmed to represent the portions of the user data and the corresponding portions of the redundant data based on an indication of a bit error rate of the memory cells;

generating, for the portions of the user data respectively, portions of known data;

generating, for each respective portion of the user data among the portions of the user data, an input item including the respective portion of the user data, a respective portion of the known data, and a respective portion of the redundant data;

providing, to an error correction module configured to detect and correct errors using an Error Correction Code (ECC) having a predetermined code rate, the input item, wherein the predetermined code rate specifies a ratio between a size of the user data and a size of codewords of the Error Correction Code (ECC) representing the user data, wherein the plurality of segments of the memory cells have a storage capacity equal to a first size of one codeword consisting of given data and redundant information generated from encoding the given data using the Error Correction Code (ECC) according to the predetermined code rate; and receiving, from the error correction module, an error-free version of the respective portion of the user data.

16. The method of claim 15, wherein the known data is independent of the states of the memory cells.

17. The method of claim 15, wherein the Error Correction Code (ECC) is a Low-Density Parity-Check (LDPC) code; and the redundant data comprises parity data generated according to the Low-Density Parity-Check (LDPC) code.

18. The method of claim 17, wherein a ratio between a number of bits of the respective portion of the redundant data and a number of bits of the input item is represented by the predetermined code rate.

19. The method of claim 18, wherein the known data is generated based on a memory address of the memory cells.

20. The method of claim 18, wherein a number of bits of the input item is equal to a number of bits of the raw data; and the portions of the user data have a same size.

* * * * *